United States Patent
Yasunami et al.

(10) Patent No.: US 7,332,258 B2
(45) Date of Patent: Feb. 19, 2008

(54) POSITIVE RESIST COMPOSITION AND PROCESS FOR FORMING PATTERN USING THE SAME

(75) Inventors: Shoichiro Yasunami, Shizuoka (JP); Koji Shirakawa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/941,925

(22) Filed: Sep. 16, 2004

(65) Prior Publication Data

US 2005/0064327 A1     Mar. 24, 2005

(30) Foreign Application Priority Data

Sep. 17, 2003  (JP)  ............ P.2003-324528

(51) Int. Cl.
*G03C 1/73*   (2006.01)
*G03F 7/039*  (2006.01)
*G03F 7/20*   (2006.01)
*G03F 7/30*   (2006.01)

(52) U.S. Cl. ............... 430/270.1; 430/326; 430/910; 430/921

(58) Field of Classification Search ......... 430/270.1, 430/905, 910, 921, 326
See application file for complete search history.

(56) References Cited

U.S. PATENT DOCUMENTS 5,561,194 A   10/1996  Cornett et al.

2002/0061464 A1 *  5/2002  Aoai et al. ............ 430/270.1
2003/0099900 A1    5/2003  Yamada et al.
2003/0194650 A1 * 10/2003  Kanna et al. .......... 430/285.1

FOREIGN PATENT DOCUMENTS

| JP | 11-282163    | * | 10/1999 |
| JP | 2001-166474 A |   | 6/2001  |
| JP | 2001-166478 A |   | 6/2001  |
| JP | 2001-194792 A |   | 7/2001  |
| JP | 2003-107708 A |   | 4/2003  |

OTHER PUBLICATIONS

Machine-assisted English translation of JP 11-282163, provided by JPO.*
Patent Abstracts of Japan (1999)—JP 11 282163 A, vol. 2000, No. 1.
European Search Report dated Feb. 3, 2005.

* cited by examiner

*Primary Examiner*—Sin Lee
(74) *Attorney, Agent, or Firm*—Sughrue Mion, Pllc.

(57) ABSTRACT

A positive resist composition comprising (A) a resin that contains a repeating unit represented by formula (1) defined in the specification and a repeating unit represented by formula (2) defined in the specification, and is insoluble or slightly soluble in an alkali developer and becomes soluble in an alkali developer by an action of an acid, and (B) a compound generating a sulfonic acid compound represented by formula (3) defined in the specification upon irradiation of actinic ray or radiation.

11 Claims, No Drawings

POSITIVE RESIST COMPOSITION AND PROCESS FOR FORMING PATTERN USING THE SAME

FIELD OF THE INVENTION

The present invention relates to a positive resist composition that is suitably used for a super microlithography process, such as production of VLSI and a high capacity microchip, and other photofabrication process. More particularly, the invention relates to a positive resist composition that is capable of forming a super fine pattern by using KrF excimer laser light, an electron beam, EUV light or the like, and is suitably used for fine processing of a semiconductor device by using KrF excimer laser light, an electron beam and EUV light.

BACKGROUND OF THE INVENTION

In the production process of semiconductor devices, such as IC and LSI, fine processing by lithography using a photoresist composition is carried out. Associated with the high integration of integrated circuits in recent years, formation of a super fine pattern in submicron region and quarter micron region has been demanded. According thereto, the exposure wavelength tends to become shorter from g-line to i-line, and further KrF excimer laser light. In these days, furthermore, lithography using an electron beam, X-ray and EUV light has been developed in addition to that using excimer laser light.

The lithography using an electron beam or EUV light is recognized as a pattern forming technique of the next generation or the generation after the next, and such a positive resist is demanded that has high sensitivity and high resolution. In particular, the high sensitivity is a significantly important demand for reducing the wafer processing time, but in the case where a positive resist for an electron beam or EUV light is pursued in sensitivity, not only the resolution is deteriorated, but also the line edge roughness is deteriorated. Therefore, there is a strong demand for development of a resist satisfying both of the factors simultaneously. The line edge roughness used herein means such a phenomenon that the edge between the resist pattern and the interface of a substrate is irregularly fluctuated in the direction perpendicular to the line direction due to the characteristics of the resist, whereby the edge of the pattern is fluctuated as viewed from the above. The fluctuation of the edge is transferred in the etching process using the resist as a mask, and thus the electric characteristics of the device are deteriorated to lower the yield thereof. In particular, improvement of the line edge roughness in the super fine region of 0.25 μm or less becomes an important problem. High sensitivity, high resolution, good pattern shape and good line edge roughness are in trade-off relationship, and it is an important problem to satisfy them simultaneously.

It is also an important problem that high sensitivity, high resolution, good pattern shape and good edge line roughness are simultaneously satisfied in the lithography using KrF excimer laser light, and solutions for the problems are demanded.

A chemically amplified resist utilizing an acid catalytic reaction has been mainly used as a resist suitable for a lithography process using KrF excimer laser light, an electron beam or EUV light, and such a chemically amplified resist composition is effectively used as a positive resist that contains as main components a phenolic polymer that is insoluble or slightly soluble in an alkali aqueous solution but becomes soluble in an alkali aqueous solution by an action of an acid (hereinafter, abbreviated as a phenolic acid decomposable resin), and an acid generator.

As the positive resist, such a resist composition has been known that contains a phenolic acid decomposable resin obtained by copolymerizing an acid decomposable acrylate monomer, and a compound capable of generating sulfonic acid upon irradiation of actinic ray or radiation (hereinafter, abbreviated as a sulfonic acid generator). Examples of the aforementioned resist composition include positive resist compositions disclosed in Patent Documents 1 to 5.

However, it is the current situation that no combination thereof simultaneously satisfies high sensitivity, high resolution, good pattern shape and good line edge roughness in the super fine region.

Patent Document 1: U.S. Pat. No. 5,561,194
Patent Document 2: JP-A-2001-166474 (the term "JP-A" as used herein means an "unexamined published Japanese patent application")
Patent Document 3: JP-A-2001-166478
Patent Document 4: JP-A-2003-107708
Patent Document 5: JP-A-2001-194792

SUMMARY OF THE INVENTION

An object of the invention is to solve the technical problems in improvement of performance in fine processing of a semiconductor device using actinic ray or radiation, in particular, KrF excimer laser light, an electron beam or EUV light.

Other object of the invention is to provide such a positive resist composition that simultaneously satisfy high sensitivity, high resolution, good pattern shape and good line edge roughness and is good in dissolution contrast, and a process for forming a pattern using the positive resist composition.

Other objects of the invention will become apparent from the following description.

As a result of earnest investigations made by the inventors, it has been found that the objects of the invention are attained by the following resist composition.

(1) A positive resist composition comprising:
(A) a resin containing a repeating unit represented by the following formula (1) and a repeating unit represented by the following formula (2), the resin being insoluble or slightly soluble in an alkali developer and becoming soluble in an alkali developer by an action of an acid, and
(B) a compound generating a sulfonic acid compound represented by the following formula (3) upon irradiation of actinic ray or radiation,

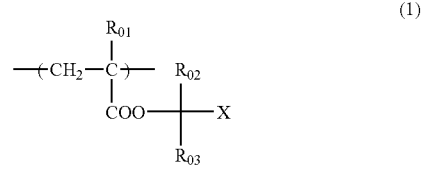

wherein $R_{01}$ represents a hydrogen atom, a methyl group, a cyano group, a halogen atom or a perfluoro group having from 1 to 4 carbon atoms, $R_{02}$ and $R_{03}$ each independently represents an alkyl group, and X represents an acid decomposable group having an alicyclic group,

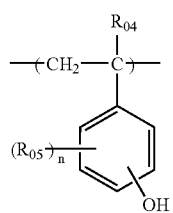

(2)

wherein $R_{04}$ represents a hydrogen atom or a methyl group, $R_{05}$ represents a hydrogen atom, an alkyl group, a halogen atom, an aryl group, an alkoxy group or an acyl group, and n represents an integer of from 0 to 4,

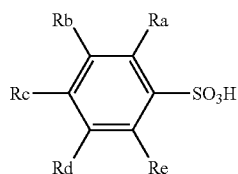

(3)

wherein Ra to Re each independently represents a hydrogen atom, an alkyl group, a cycloalkyl group, an alkoxy group, a halogen atom, a hydroxyl group, a carboxyl group, an alkyloxycarbonyl group, an alkylcarbonyloxy group, an aryl group or an aralkyl group.

(2) The positive resist composition as described in item (1), which further comprises an organic basic compound.

(3) The positive resist composition as described in item (1) or (2), wherein X in formula (1) represents a bridged alicyclic group.

(4) The positive resist composition as described in item (3), wherein the bridged alicyclic group represented by X in formula (1) is an adamantyl group.

(5) The positive resist composition as described in any one of items (1) to (4), which further comprises a compound generating a non-aromatic sulfonic acid compound upon irradiation of actinic ray or radiation.

The invention includes the following preferred embodiments.

(6) The positive resist composition as described in any one of items (1) to (5), wherein the resin (A) further contains a repeating unit represented by the following formula (4):

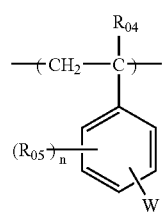

(4)

wherein $R_{04}$, $R_{05}$ and n have the same meanings as $R_{04}$, $R_{05}$ and n in formula (2) respectively, and W represents a group that is not decomposed by an action of an acid.

(7) The positive resist composition as described in any one of items (1) to (6), which further comprises a fluorine surfactant and/or a silicone surfactant.

(8) A process for forming a pattern comprising steps of: forming a resist film with the positive resist composition as described in any one of items (1) to (7); exposing the resist film; and developing the exposed resist film.

DETAILED DESCRIPTION OF THE INVENTION

According to the invention, such a positive resist composition that simultaneously satisfy high sensitivity, high resolution, good pattern shape and good line edge roughness and is good in dissolution contrast, and a process for forming a pattern using the positive resist composition can be provided.

The compounds used in the invention will be described in detail below.

In the expressions of group (atomic group) herein, an expression without indication of substituted or unsubstituted encompasses both a group having no substituent and a group having a substituent. For example, the expression "an alkyl group" encompasses both an alkyl group having no substituent (an unsubstituted alkyl group) and an alkyl group having a substituent (a substituted alkyl group).

[1] Resin (A) that is Insoluble or Slightly Soluble in an Alkali Developer but Becomes Soluble in an Alkali Developer by an Action of an Acid:

The resin (A) used in the invention that is insoluble or slightly soluble in an alkali developer but becomes soluble in an alkali developer by an action of an acid contains a repeating unit represented by formula (1) and a repeating unit represented by formula (2),

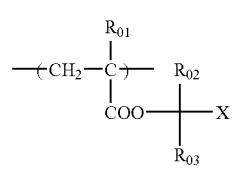

(1)

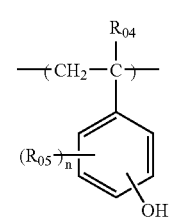

(2)

In formula (1), $R_{01}$ represents a hydrogen atom, a methyl group, a cyano group, a halogen atom or a perfluoro group having from 1 to 4 carbon atoms, $R_{02}$ and $R_{03}$ each independently represents an alkyl group, and X represents an acid decomposable group having an alicyclic group.

In formula (2), $R_{04}$ represents a hydrogen atom or a methyl group, $R_{05}$ represents a hydrogen atom, an alkyl group, a halogen atom, an aryl group, an alkoxy group or an acyl group, and n represents an integer of from 0 to 4.

In formula (1), $R_{01}$ represents a hydrogen atom, a methyl group, a cyano group, a halogen atom or a perfluoro group (i.e., a $C_mF_{2m+1}$ group, wherein m represents an integer of from 1 to 4). $R_{01}$ preferably represents a hydrogen atom, a methyl group or a $C_mF_{2m+1}$ group (wherein m preferably represents 1), and particularly preferably a hydrogen atom or a methyl group.

$R_{02}$ and $R_{03}$ may have a substituent and each independently represents an alkyl group, preferably an alkyl group having from 1 to 16 carbon atoms, more preferably an alkyl group having from 1 to 12 carbon atoms, and particularly preferably an alkyl group having from 1 to 8 carbon atoms (such as a methyl group, an ethyl group, a propyl group, a butyl group, a hexyl group and an octyl group).

Examples of the substituent include a hydroxyl group, a carboxyl group, a halogen atom (such as a fluorine atom and a bromine atom), an alkoxy group (such as a methoxy group, an ethoxy group, a propoxy group and a butoxy group), an alkyloxycarbonyl group and an alkylcarbonyloxy group.

The alicyclic group represented by X may be a monocyclic, bicyclic or bridged alicyclic group, and preferably an alicyclic group having from 5 to 25 carbon atoms.

The alicyclic group may have a substituent, and examples of the substituent include those exemplified as the substituent for $R_{02}$, and an alkyl group (such as a methyl group, an ethyl group, a propyl group and a butyl group).

X preferably represents an alicyclic group having from 5 to 25 carbon atoms, more preferably an alicyclic group having from 6 to 20 carbon atoms, and particularly preferably a cycloalkyl group having from 6 to 15 carbon atoms.

Examples of the structure of the alicyclic group represented by X are shown below.

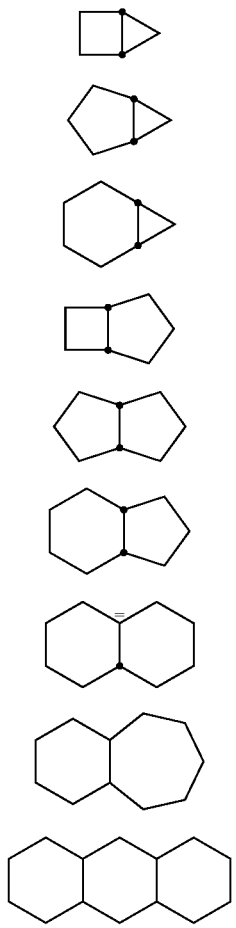

-continued

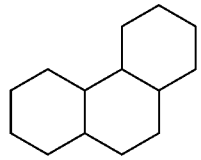

(10)

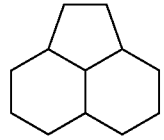

(11)

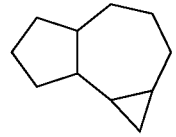

(12)

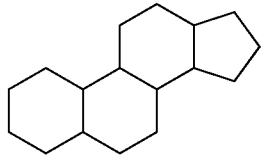

(13)

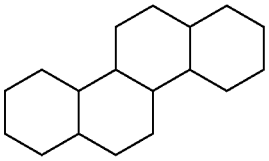

(14)

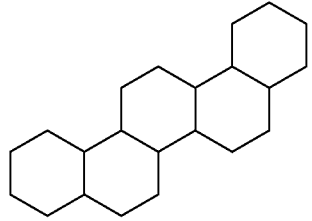

(15)

(16)

(17)

(18)

(19)

(20)

-continued
(21)
(22)
(23)
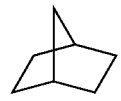
(24)
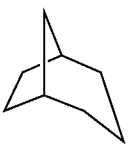
(25)
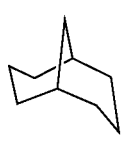
(26)
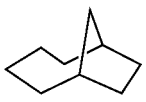
(27)
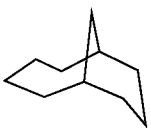
(28)
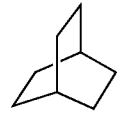
(29)
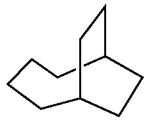
(30)
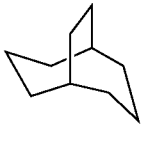
(31)
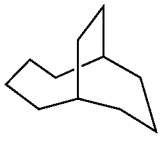
(32)
-continued
(33)
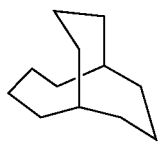
(34)
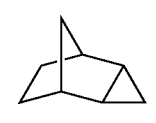
(35)
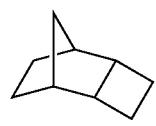
(36)
(37)
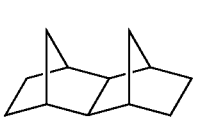
(38)
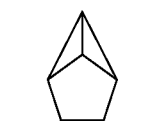
(39)
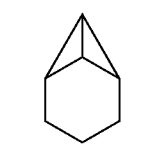
(40)
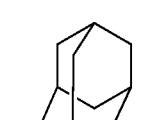
(41)
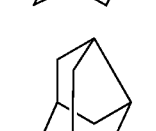
(42)
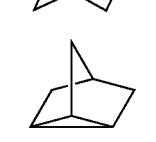
(43)
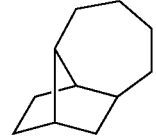
(44)
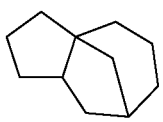

-continued

(45)
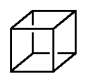

(46)
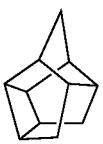

(47)

(48)

(49)

(50)
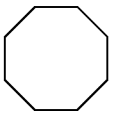

Preferred examples of the aforementioned alicyclic group include an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group. More preferred examples thereof include an adamantyl group, a decalin residue, a norbornyl group, a cedrol group, a cyclohexyl group, a cycloheptyl group, a cyclooctyl group, a cyclodecanyl group and a cyclododecanyl group.

In formula (2), $R_{04}$ represents a hydrogen atom, a methyl group, a cyano group, a halogen atom or a perfluoro group (i.e., a $C_mF_{2m+1}$ group, wherein m represents an integer of from 1 to 4). $R_{04}$ preferably represents a hydrogen atom, a methyl group or a $C_mF_{2m+1}$ group (wherein m preferably represents 1), and particularly preferably a hydrogen atom or a methyl group.

The alkyl group represented by $R_{05}$ may have a substituent, and preferably includes an alkyl group having from 1 to 8 carbon atoms, for example, a methyl group, an ethyl group, a n-butyl group, a sec-butyl group, a hexyl group and an octyl group.

The alkoxy group represented by $R_{05}$ may have a substituent, and preferably includes an alkoxy group having from 1 to 8 carbon atoms, for example, a methoxy group, an ethoxy group, a propoxy group, a butoxy group, a pentyloxy group, a hexyloxy group and a cyclohexyloxy group.

The aryl group represented by $R_{05}$ may have a substituent, and preferably includes an aryl group having from 6 to 15 carbon atoms, for example, a phenyl group, a tolyl group, a naphthyl group and an anthryl group.

The acyl group represented by $R_{05}$ may have a substituent, and preferably includes an acyl group having from 1 to 8 carbon atoms, for example, a formyl group, an acetyl group, a propanoyl group, a butanoyl group, a pivaloyl group and a benzoyl group.

Examples of the substituent that the aforementioned groups may have include a hydroxyl group, a carboxyl group, a halogen atom (such as a fluorine atom, a chlorine atom, a bromine atom and an iodine atom) and an alkoxy group (such as a methoxy group, an ethoxy group, a propoxy group and a butoxy group).

In formula (2), the OH group may be bonded to any position of the benzene ring, and is preferably bonded at the m-position or the p-position of the styrene skeleton, and particularly preferably at the p-position.

Specific examples of the repeating unit represented by formula (2) are shown below, but the invention is not limited thereto.

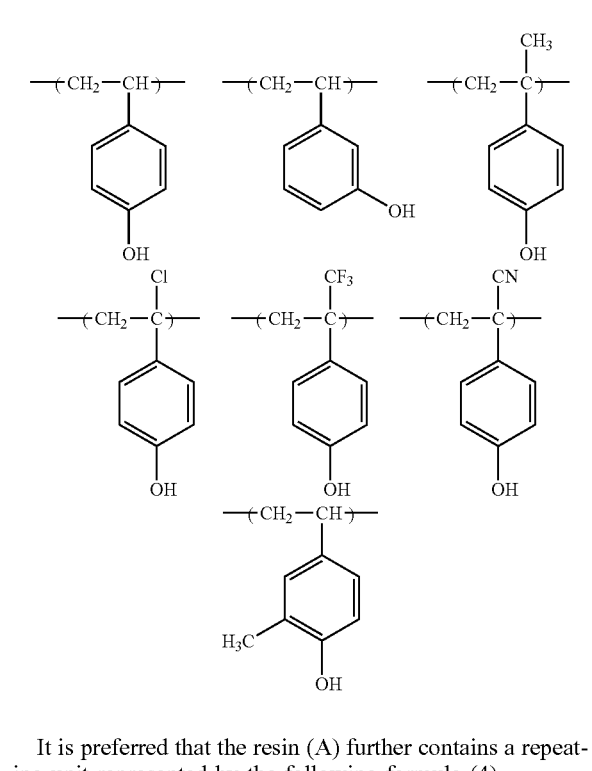

It is preferred that the resin (A) further contains a repeating unit represented by the following formula (4), (4)
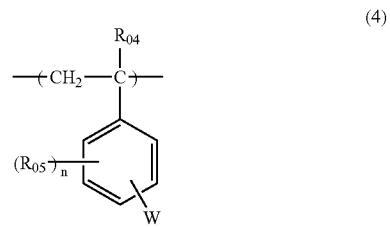

wherein $R_{04}$, $R_{05}$ and n have the same meanings as $R_{04}$, $R_{05}$ and n in formula (2) respectively, and W represents a group that is not decomposed by an action of an acid.

$R_{04}$, $R_{05}$ and n in the repeating unit represented by formula (4) each may be the same as or different from $R_{04}$, $R_{05}$ and n in the repeating unit represented by formula (2).

W represents a group that is not decomposed by an action of an acid (hereinafter, sometimes referred to as an acid stable group), and specific examples thereof include a hydrogen atom, a halogen atom, an alkyl group, a cycloalkyl group, an alkenyl group, an aryl group, an alkyloxy group (provided that an —O-tert-alkyl group is omitted), an acyl group, a cycloalkyloxy group, an alkenyloxy group, an aryloxy group, an alkylcarbonyloxy group, an alkylamidomethyloxy group, an alkylamido group, an arylamidomethyl group and an arylamido group. The acid stable group is preferably an acyl group, an alkylcarbonyloxy group, an alkyloxy group, a cycloalkyloxy group, an aryloxy group, an alkylamidmethyloxy group or an alkylamido group, and more preferably an acyl group, an alkylcarbonyloxy group, an alkyloxy group, acycloalkyloxy group or an aryloxy group.

In the acid stable group represented by W, the alkyl group is preferably an alkyl group having from 1 to 4 carbon atoms, such as a methyl group, an ethyl group, a propyl group, a n-butyl group, a sec-butyl group and a tert-butyl group, the cycloalkyl group is preferably a cycloalkyl group having from 3 to 10 carbon atoms, such as a cyclopropyl group, a cyclobutyl group, a cyclohexyl group and an adamantyl group, the alkenyl group is preferably an alkenyl group having from 2 to 4 carbon atoms, such as a vinyl group, a propenyl group, an allyl group and a butenyl group, the aryl group is preferably an aryl group having from 6 to 14 carbon atoms, such as a phenyl group, a xylyl group, a tolyl group, a cumenyl group, a naphthyl group and an anthryl group, and the alkoxy group is preferably an alkoxy group having from 1 to 4 carbon atoms, such as a methoxy group, an ethoxy group, a hydroxyethoxy group, a propoxy group, a hydroxypropoxy group, a n-butoxy group, an isobutoxy group and a sec-butoxy group.

The group represented by W may be bonded to any position of the benzene ring, and is preferably bonded at the m-position or the p-position of the styrene skeleton, and particularly preferably at the p-position.

Specific examples of the repeating unit represented by formula (4) are shown below, but the invention is not limited thereto.

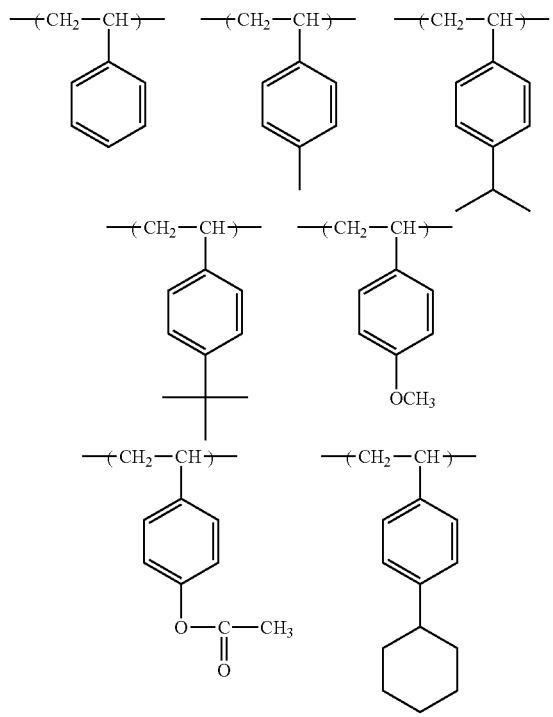

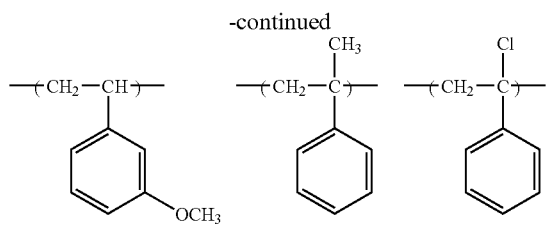

The content of the repeating unit represented by formula (1) in the resin (A) is preferably from 3 to 80% by mole, more preferably from 5 to 70% by mole, and particularly preferably from 5 to 50% by mole, based on the total repeating units. The content thereof is preferably 3% by mole or more for certainly preventing reduction in thickness on the unexposed area and deterioration in resolution, and it is preferably 80% by mole or less for improvement in adhesion to a substrate and prevention of scum.

The content of the repeating unit represented by formula (2) in the resin (A) is preferably from 20 to 97% by mole, more preferably from 30 to 95% by mole, and particularly preferably from 50 to 95% by mole, based on the total repeating units. The content thereof is preferably 20% by mole of more for preventing adhesion failure to a substrate and scum, and it is preferably 97% by mole or less for certainly preventing reduction in thickness on the unexposed area and deterioration in resolution.

The resin (A) may contain the repeating unit represented by formula (4), and it is preferred for improvement in film quality and prevention in reduction of the thickness on the unexposed area. The content of the repeating unit represented by formula (4) in the resin (A) is preferably not more than 50% by mole, more preferably not more than 40% by mole, and particularly preferably not more than 30% by mole.

The resin (A) may be copolymerized with other suitable polymerizable monomer capable of introducing an alkali solubilizing group, such as a phenolic hydroxyl group and a carboxyl group, for maintaining the developing property with an alkali developer, and may be copolymerized with other hydrophobic polymerizable monomer, such as an alkyl acrylate and an alkyl methacrylate, for improving the film quality.

The resin (A) may further contain a monomer having other acid decomposable group than the acid decomposable group contained in the repeating unit represented by formula (1), and examples thereof include a group represented by formula —C(=O)—$X_1$—$R_0$.

In the aforementioned formula, $R_0$ represents a tertiary alkyl group, such as a tert-butyl group and a tert-amyl group, a 1-alkoxyethyl group, such as an isobornyl group, a 1-ethoxyethyl group, a 1-butoxyethyl group, a 1-isobutoxyethtyl group and a 1-cyclohexyloxyethyl group, an alkoxymethyl group, such as a 1-methoxymethyl group and a 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group and a mevalonic lactone group, and $X_1$ represents an oxygen atom, a sulfur atom, —NH—, —$NHSO_2$— or —$NHSO_2NH$—.

The resin (A) preferably has a weight average molecular weight (Mw) of from 1,000 to 200,000, more preferably from 1,500 to 100,000, and particularly preferably from 2,000 to 50,000. The weight average molecular weight is preferably 1,000 or more for preventing reduction in thickness on the unexposed area, and it is preferably 200,000 or less for preventing reduction in sensitivity due to reduction in dissolution rate of the resin itself in an alkali solution. The dispersion degree (Mw/Mn) of the resin (A) is preferably from 1.0 to 4.0, more preferably from 1.0 to 3.0, and particularly preferably from 1.0 to 2.5.

The weight average molecular weight referred herein is a value measured by gel permeation chromatography and calculated in terms of polystyrene.

The resin (A) may be used as a mixture of two or more thereof.

The addition amount of the resin (A) is ordinarily from 10 to 96% by weight, preferably from 15 to 96% by weight, and particularly preferably from 20 to 95% by weight, based on the total solid content of the positive resist composition.

Specific examples of the resin (A) are shown below, but the invention is not limited thereto.

A-1
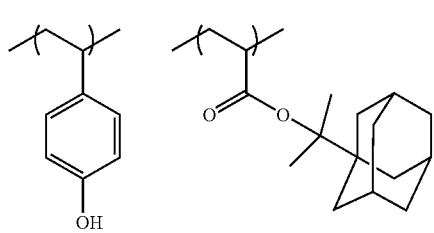

A-2
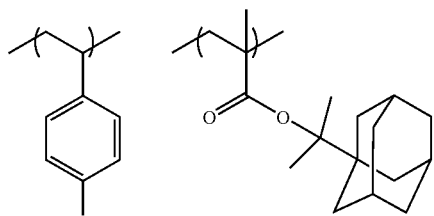

A-3
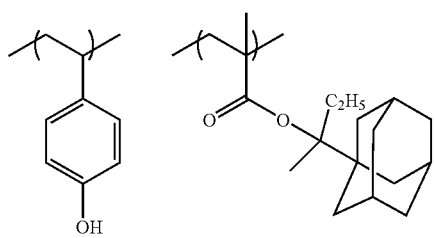

A-4
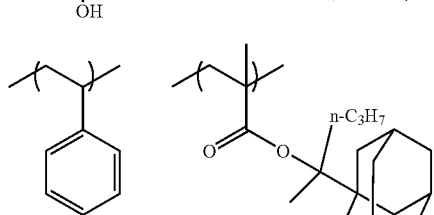

A-5
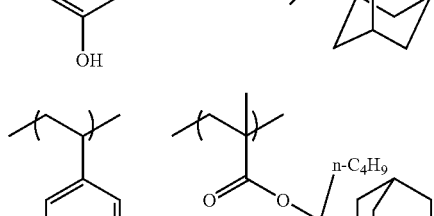

-continued

A-6
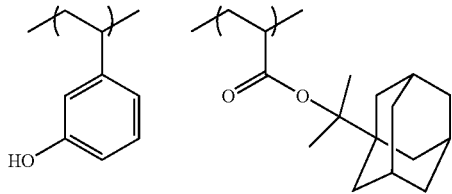

A-7
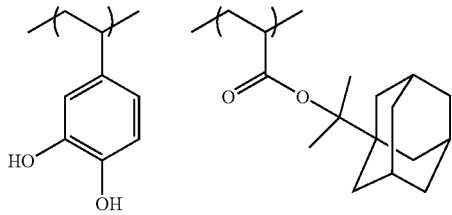

A-8
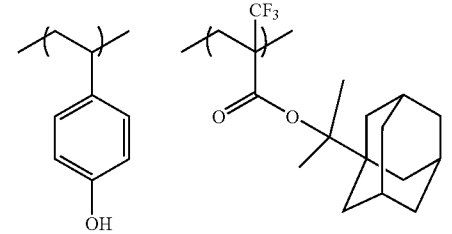

A-9
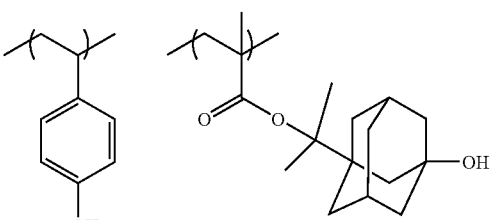

A-10
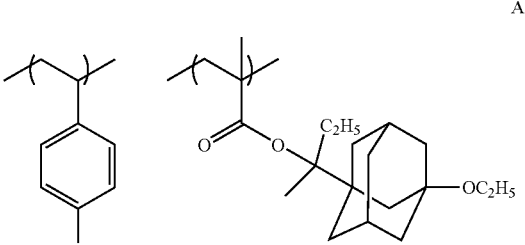

A-11
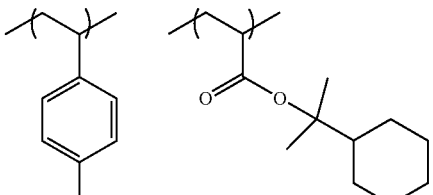

A-12
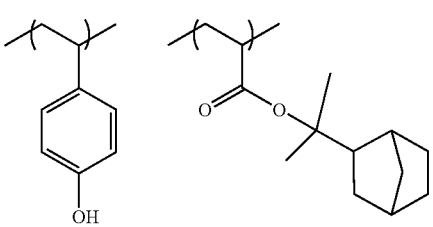

-continued

A-13
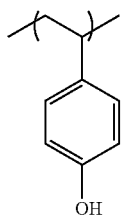
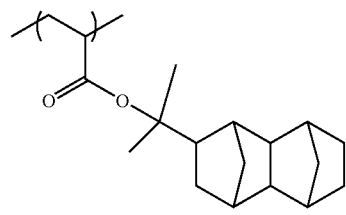

A-14
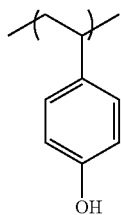
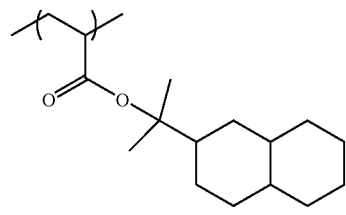

A-15
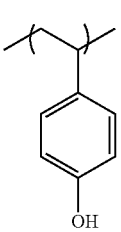
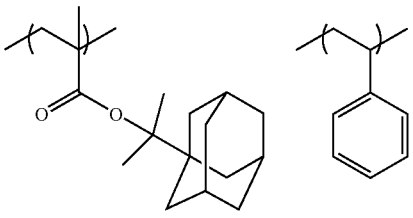

A-16
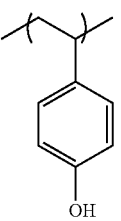
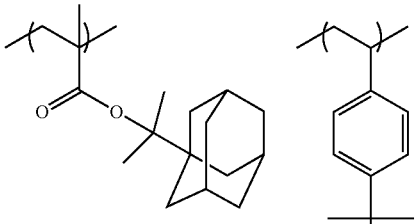

A-17
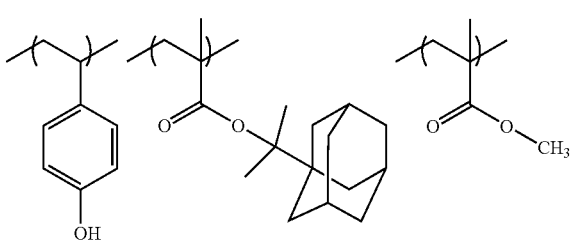

A-18
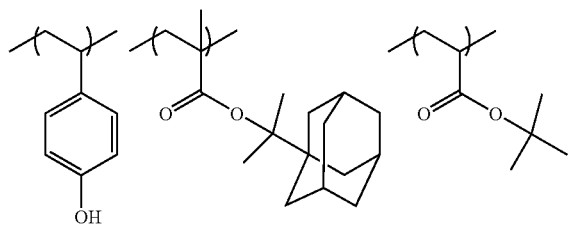

[2] Compound (B) that Generates a Sulfonic Acid Compound Upon Irradiation of Actinic Ray or Radiation:

The compound (B) generating a sulfonic acid compound upon irradiation of actinic ray or radiation is such a compound that generates a sulfonic acid compound represented by formula (3) shown below upon irradiation of actinic ray or radiation, such as KrF excimer laser light, an electron beam and EUV light (hereinafter, sometimes referred to as a sulfonic acid generator (B) Examples thereof include a diazonium salt, a phosphonium salt, a sulfonium salt, an iodonium salt, an imidosulfonate, an oximesulfonate, a diazodisulfone, a disulfone and an o-nitrobenzylsulfonate.

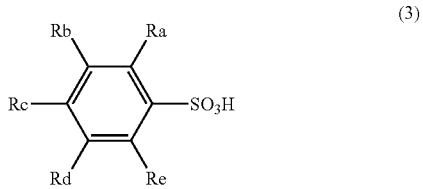

(3)

In formula (3), Ra to Re each independently represents a hydrogen atom, an alkyl group, a cycloalkyl group, an alkoxy group, a halogen atom, a hydroxyl group, a carboxyl group, an alkyloxycarbonyl group, an alkylcarbonyloxy group, an aryl group or an aralkyl group.

The alkyl group represented by any one of Ra to Re may have a substituent, and is preferably an alkyl group having from 1 to 20 carbon atoms (as a substituted alkyl group, particularly an alkyl group having from 1 to 8 carbon atoms substituted with a halogen atom), and more preferably an alkyl group having from 1 to 16 carbon atoms (such as a methyl group, an ethyl group, a propyl group, a butyl group, an octyl group and a dodecyl group, and particularly an alkyl group having from 1 to 4 carbon atoms substituted with a halogen atom, such as a fluorine atom).

The cycloalkyl group may have a substituent, and is preferably a cycloalkyl group having from 5 to 10 carbon atoms, such as a cyclopentyl group and a cyclohexyl group.

The alkoxy group may have a substituent, and is preferably an alkoxy group having from 1 to 12 carbon atoms, and more preferably an alkoxy group having from 1 to 6 carbon atoms (such as a methoxy group, an ethoxy group and a butoxy group).

The alkyloxycarbonyl group may have a substituent, and preferably has from 2 to 8 carbon atoms, such as a methoxycarbonyl group, an ethoxycarbonyl group and a propoxycarbonyl group.

The alkylcarbonyloxy group may have a substituent, and preferably has from 2 to 8 carbon atoms, such as a methylcarbonyloxy group and an ethylcarbonyloxy group.

The aryl group may have a substituent, and preferably has from 6 to 15 carbon atoms, such as a phenyl group and a naphthyl group.

The aralkyl group may have a substituent, and is preferably an aralkyl group having from 7 to 16 carbon atoms, such as a benzyl group.

Examples of the substituent that the alkyl moiety of the alkyl group, the cycloalkyl group, the alkenyl group and the alkoxy group represented by any one of Ra to Re may have include a halogen atom (such as a chlorine atom, a bromine atom and a fluorine atom), an aryl group (such as a phenyl group and a naphthyl group), a hydroxyl group and an alkoxy group (such as a methoxy group, an ethoxy group and a butoxy group).

Examples of the substituent that the aryl moeity of the aryl group and the aralkyl group represented by any one of Ra to Re may have include a halogen atom (such as a chlorine atom, a bromine atom and a fluorine atom), a nitro group, a cyano group, an alkyl group (such as a methyl group, an ethyl group, a tert-butyl group, a tert-amyl group and an octyl group), a hydroxyl group and an alkoxy group (such as a methoxy group, an ethoxy group and a butoxy group).

Ra to Re each preferably independently represents a hydrogen atom, an alkyl group having from 1 to 16 carbon atoms (such as a methyl group, an ethyl group, a propyl group, a butyl group, an octyl group and a dodecyl group, and particularly an alkyl group having from 1 to 4 carbon atoms substituted with a halogen atom, such as a fluorine atom), an alkoxy group having from 1 to 6 carbon atoms (such as a methoxy group, an ethoxy group and a butoxy group), a halogen atom (such as a fluorine atom, a chlorine atom and a bromine atom) or a hydroxyl group, and particularly preferably a hydrogen atom, an alkyl group having from 1 to 12 carbon atoms (as a substituted alkyl group, particularly an alkyl group having from 1 to 4 carbon atoms substituted with a halogen atom), an alkoxy group having from 1 to 8 carbon atoms, a hydroxyl group or a fluorine atom.

Polymer compounds having the group or compound generating an acid upon irradiation of actinic ray or radiation introduced to the main chain or side chain thereof, for example, compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 may also be used.

Furthermore, compounds generating an acid with light described in U.S. Pat. No. 3,779,778 and European Patent 126,712 can also be used.

Examples of the sulfonic acid generator preferably used in the invention from the standpoint of improving image performances, such as resolution and pattern shape include a sulfonium salt, an iodonium salt, an imidosulfonate, an oximesulfonate, a diazodisulfone and a disulfone.

Specific examples of the sulfonic acid generator (B) generating a sulfonic acid compound represented by formula (3) are shown below, but the invention is not limited thereto.

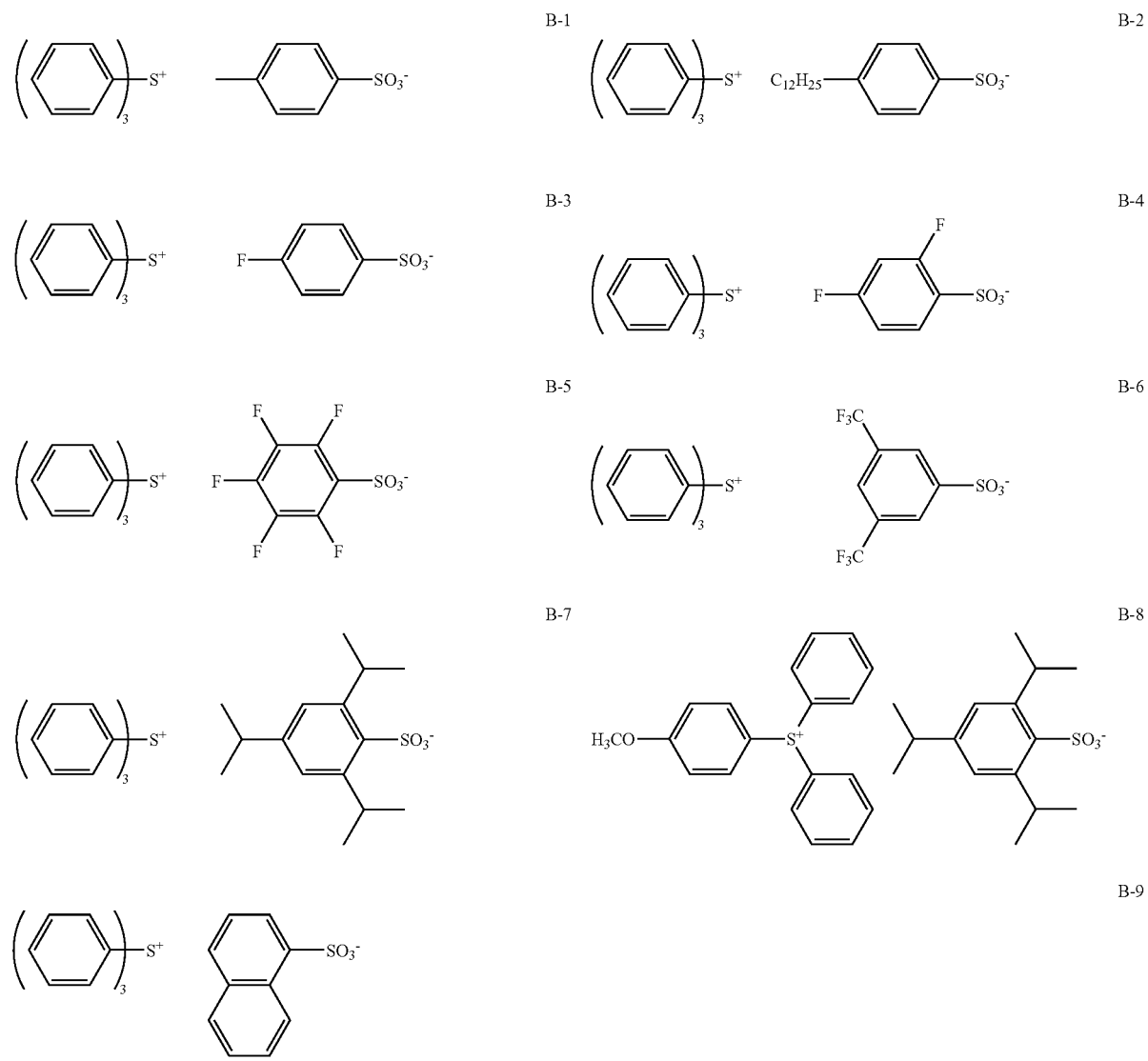

-continued
B-10
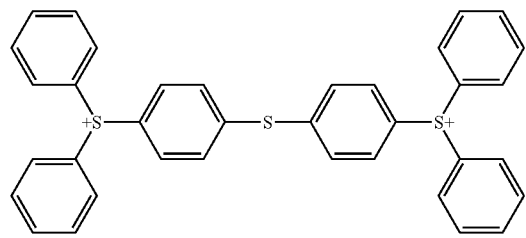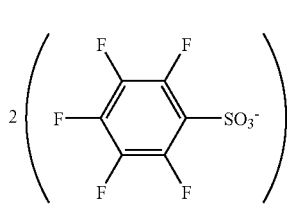
B-11
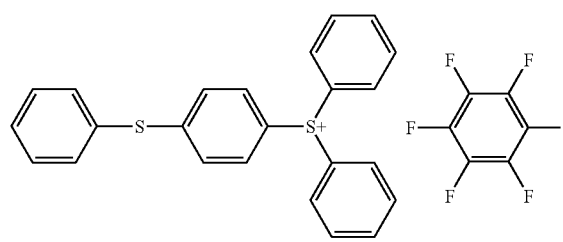
B-12
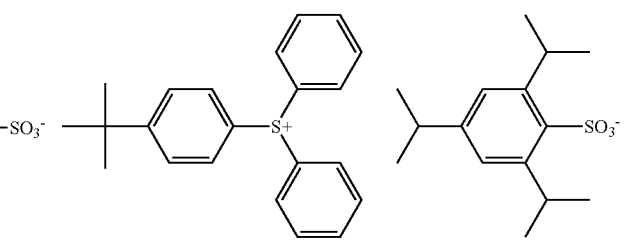
B-13
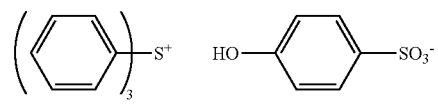
B-14
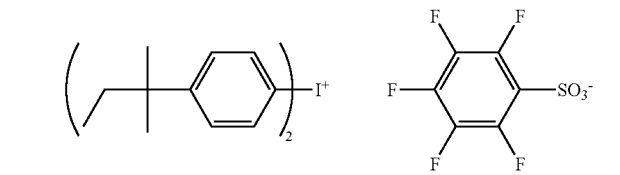
B-15
B-16
B-17
B-18
B-19
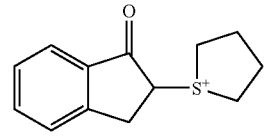
B-20
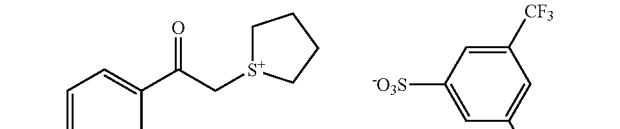
B-21
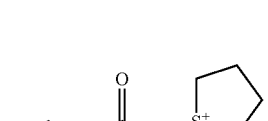
B-22
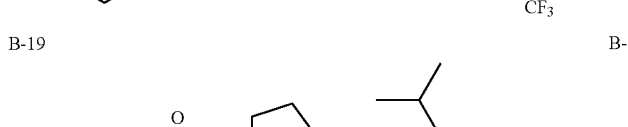

-continued
B-23
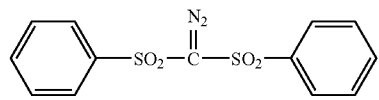
B-24
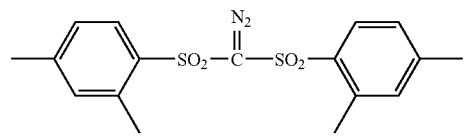
B-25
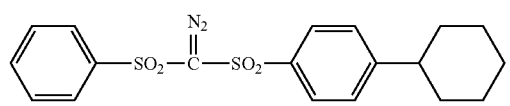
B-26
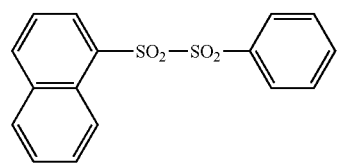
B-27
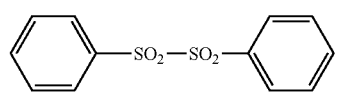
B-28
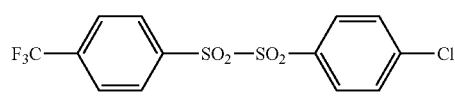
B-29
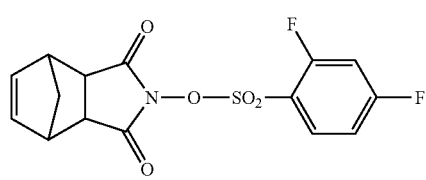
B-30
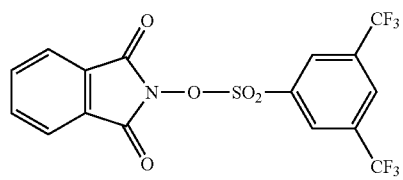
B-31
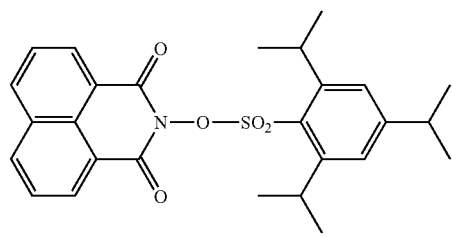
B-32
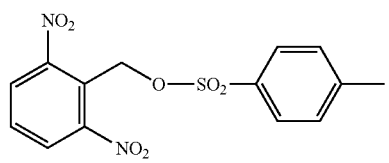
B-33
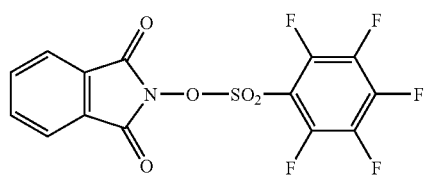
B-34
B-35
B-36

-continued

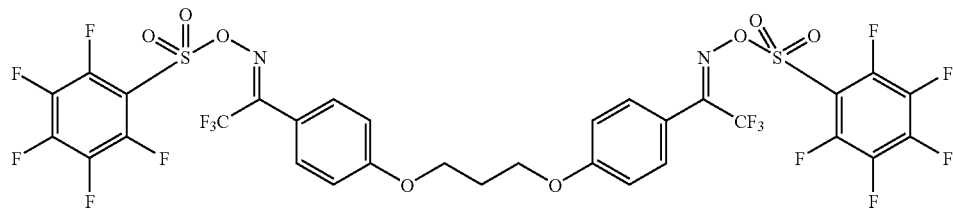
B-37

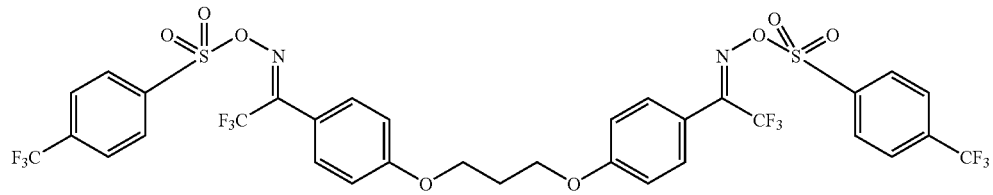
B-38

The content of the sulfonic acid generator (B) is ordinarily from 5 to 20% by weight, preferably from 6 to 18% by weight, and particularly preferably from 7 to 16% by weight, based on the total solid content of the resist composition. The content of the sulfonic acid generator (B) is preferably 5% by weight or more from the standpoint of sensitivity and line edge roughness, and it is preferably 20% by weight or less from the standpoint of resolution, pattern shape and film quality. The sulfonic acid generator (B) may be used solely or as a mixture of two or more thereof.

[3] Acid Generator (C) Generating a Non-aromatic Sulfonic Acid:

In the invention, an acid generator (C) that generates a non-aromatic sulfonic acid (hereinafter, sometimes referred to as a sulfonic acid generator (C)) may be used in combination with the sulfonic acid generator (B) generating an aromatic sulfonic acid represented by formula (3).

The non-aromatic sulfonic acid is preferably an alkylsulfonic acid, and more preferably an alkylsulfonic acid having from 2 to 20 carbon atoms. The alkyl moiety thereof may have a substituent, examples of which include a hydroxyl group, a carboxyl group, a halogen atom (such as a fluorine atom, a bromine atom and a chlorine atom), an alkoxy group (such as a methoxy group, an ethoxy group and a butoxy group), an aryl group and a cycloalkyl group (such as a cyclohexyl group).

The non-aromatic sulfonic acid is more preferably an alkylsulfonic acid having from 2 to 17 carbon atoms, and the alkyl moiety thereof may have a substituent, preferable example of which includes a fluorine atom.

Specific examples of the sulfonic acid generator (C) are shown below, but the invention is not limited thereto.

C-1

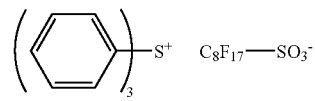

C-2

(shown at bottom left continued)

-continued

C-3

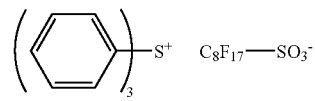

C-4

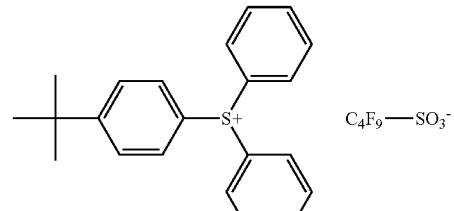

C-5

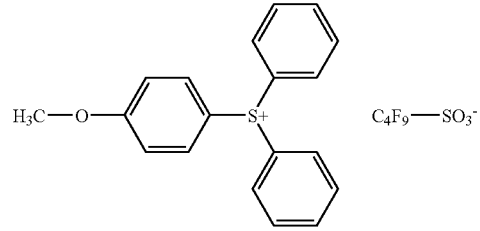

C-6

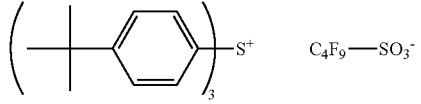

C-7

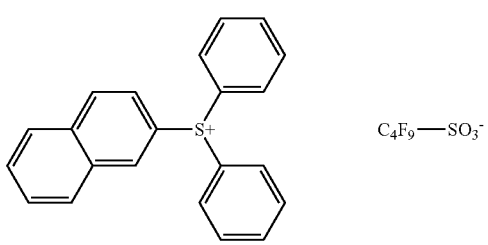

-continued
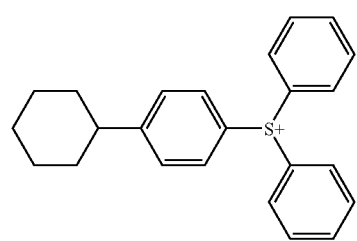 C-8
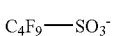
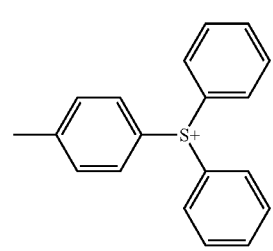 C-9
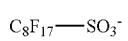
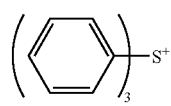 C-10
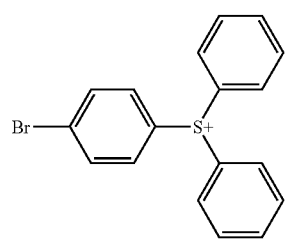 C-11
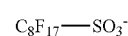
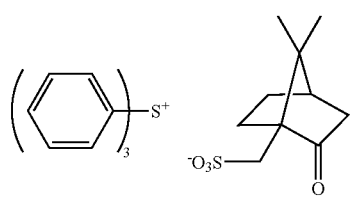 C-12
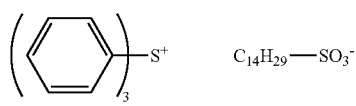 C-13
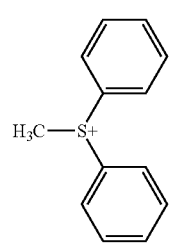 C-14
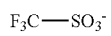
-continued
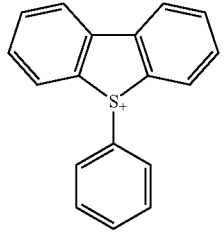 C-15
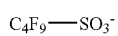
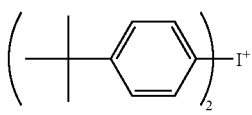 C-16
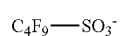
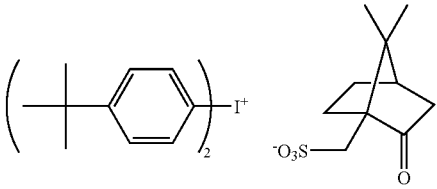 C-17
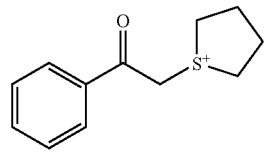 C-18
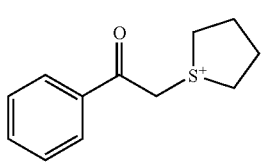 C-19
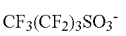
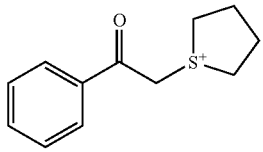 C-20
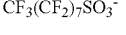
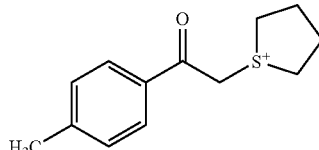 C-21
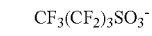
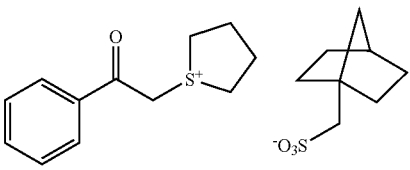 C-22
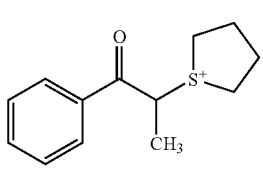 C-23
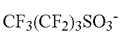

-continued
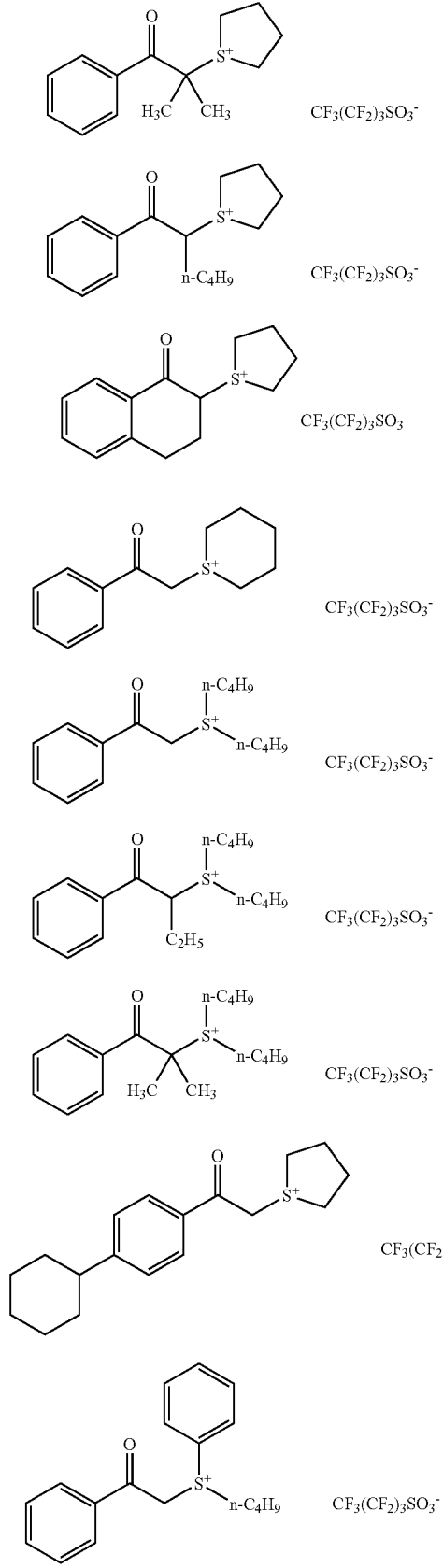
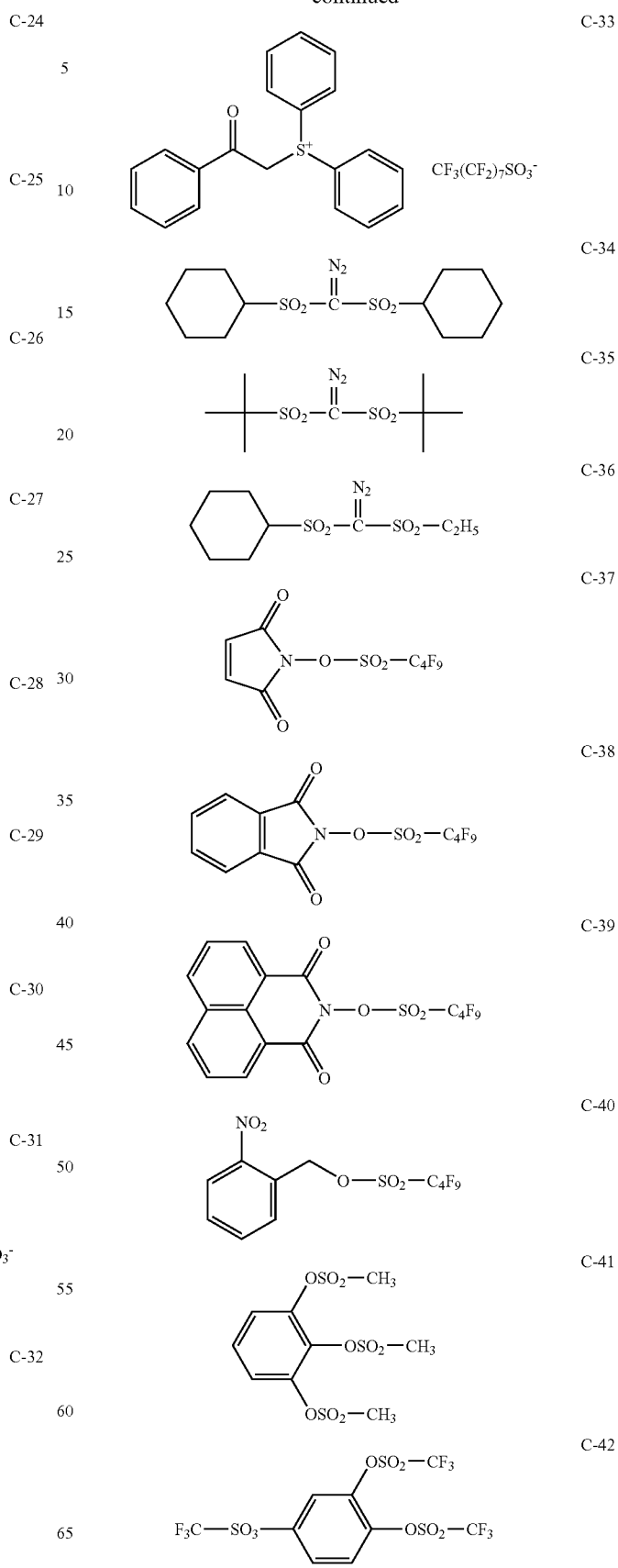

-continued

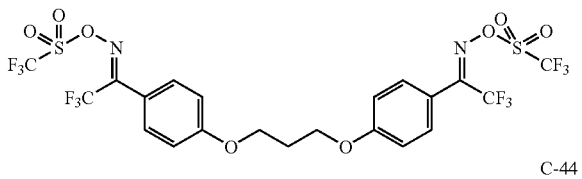

C-43

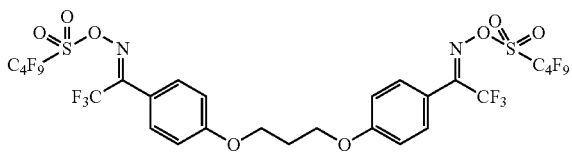

C-44

In the case where the sulfonic acid generator (C) is used in combination, the content thereof is preferably not more than 15% by weight, more preferably not more than 10% by weight, and particularly preferably not more than 7% by weight, based on the total solid content of the resist composition.

The weight ratio of the sulfonic acid generator (B) to the sulfonic acid generator (C) ((B)/(C)) is ordinarily from 100/0 to 5/95, preferably from 100/0 to 20/80, and more preferably from 100/0 to 40/60.

[4] Organic Basic Compound:

The use of an organic basic compound is preferred in the invention from the standpoint of improvement in performance, such as resolution, and improvement in storage stability. As the organic basic compound, a compound containing a nitrogen atom is more preferred.

Preferred examples of the organic basic compound used in the invention include a compound having a stronger basicity than phenol.

Preferred examples of the chemical environment thereof include structures represented by the following formulae (A) to (E). The structures represented by formulae (A) to (E) each may be a part of a cyclic structure.

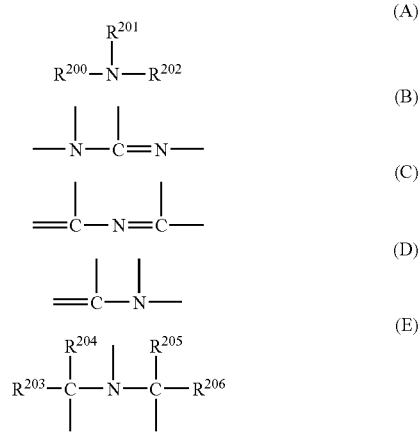

In formula (A), $R^{200}$ $R^{201}$ and $R^{202}$, which may be the same or different, each represents a hydrogen atom, an alkyl or cycloalkyl group having from 1 to 20 carbon atoms or an aryl group having from 6 to 20 carbon atoms, or $R^{201}$ and $R^{202}$ may be combined with each other to from a ring.

The alkyl group, the cycloalkyl group and the aryl group represented by any one of $R^{200}$, $R^{201}$ and $R^{202}$ may have a substituent. Preferred examples of the alkyl group and the cycloalkyl group each having a substituent include an aminoalkyl or aminocycloalkyl group having from 1 to 20 carbon atoms and a hydroxyalkyl group having from 1 to 20 carbon atoms.

In formula (E), $R^{203}$, $R^{204}$, $R^{205}$ and $R^{206}$, which may be the same as or different, each represents an alkyl or cycloalkyl group having from 1 to 6 carbon atoms.

More preferred examples of the organic basic compound include a nitrogen-containing basic compound having two or more nitrogen atoms in different chemical environments in one molecule, and particularly preferably a compound having both a substituted or unsubstituted amino group and a cyclic structure containing a nitrogen atom or a compound having an alkylamino group.

Preferred specific examples of the nitrogen-containing basic compound include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. Preferred examples of the substituent that the compound has include an amino group, an alkylamino group, an aminoaryl group, an arylamino group, an alkyl group (as a substituted alkyl group, particularly an aminoalkyl group), an alkoxy group, an acyl group, an acyloxy group, an aryl group, an aryloxy group, a nitro group, a hydroxyl group and a cyano group.

Particularly preferred specific examples of the nitrogen-containing basic compound include guanidine, 1,1-methylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine, but the invention is not limited thereto.

A tetraalkylammonium salt type nitrogen-containing basic compound may also be used. Among the compounds, a tetraalkylammoniumhydroxide having from 1 to 8 carbon atoms (such as tetramethylammoniumhydroxide, tetraethylammoniumhydroxide and tetra-(n-butyl)ammoniumhydroxide) is preferred.

The nitrogen-containing basic compounds may be used solely or in combination of two or more thereof.

The ratio of the acid generator and the organic basic compound used in the composition ((total amount of acid generator)/(organic basic compound) by mole) is preferably from 2.5 to 300. The ratio is preferably 2.5 or more for improving the sensitivity, and is preferably 300 or less for suppressing thickening of a resist pattern due to lapse of time after exposure to heat treatment, so as to improve the resolution. The ratio (total amount of acid generator)/(organic basic compound) by mole is more preferably from 5.0 to 200, and more preferably from 7.0 to 150.

[5] Surfactant:

A surfactant may be used in the invention, which is preferred from the standpoint of the film forming property, the adhesion of pattern and reduction in development defect.

Specific examples of the surfactant include a nonionic surfactant, for example, a polyoxyethylene alkyl ether, such as polyoxyethylene lauryl ether, polyoxyethylene stearyl ether, polyoxyethylene cetyl ether and polyoxyethylene oleyl ether, a polyoxyethylene alkylaryl ether, such as polyoxyethylene octylphenol ether and polyoxyethylene nonylphenol ether, a polyoxyethylene-polyoxypropylene block copolymer, a sorbitan fatty acid ester compound, such as sorbitan monolaurate, sorbitan monopalmitate, sorbitan monostearate, sorbitan monooleate, sorbitan trioleate and sorbitan tristearate, and a polyoxyethylene sorbitan fatty acid ester, such as polyoxyethylene sorbitan monolaurate, polyoxyethylene sorbitan monopalmitate, polyoxyethyelene sorbitan monostearate, polyoxyethylene sorbitan trioleate and polyoxyethylene sorbitan tristearate, a fluorine surfactant or a silicone surfactant, for example, Eftop EF301, EF303 and EF352 (produced by Shin-Akita Kasei Co., Ltd.), Megafac F171 and F173 (produced by Dainippon Ink and Chemicals, Inc.), Fluorad FC430 and FC431 (produced by Sumitomo 3M, Ltd.), Asahiguard AG710 and Surflon S-382, SC101, SC102, SC103, SC104, SC105 and SC106 (produced by Asahi Glass Co., Ltd.) and Troysol S-366 (produced by Troy Chemical Industries, Inc.), an organosiloxane polymer KP341 (produced by Shin-Etsu Chemical Co., Ltd.), and an acrylic acid or methacrylic acid (co)polymer Polyflow No. 75 and No. 95 (produced by Kyoeisha Chemical Co., Ltd.). The amount of the surfactant used is ordinarily 2 parts by weight or less, and preferably 1 part by weight or less, per 100 parts by weight of the solid content of the composition of the invention.

The surfactant may be used solely or in combination of two or more thereof.

It is preferred that a fluorine and/or silicone surfactant (a fluorine surfactant, a silicone surfactant or a surfactant containing both a fluorine atom and a silicon atom) is used solely or in combination of two or more thereof as the surfactant.

Examples of the surfactant include surfactants disclosed in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. The following commercially available surfactants may also be used as they are.

Examples of the commercially available surfactants include fluorine surfactants and silicone surfactants, such as Eftop EF301 and EF303 (produced by Shin-Akita Kasei Co., Ltd.), Fluorad FC430 and FC431 (produced by Sumitomo 3M, Ltd.), Megafac F171, F173, F176, F189 and R08 (produced by Dainippon Ink and Chemicals, Inc.), Surflon S-382, SC101, SC102, SC103, SC104, SC105 and SC106 (produced by Asahi Glass Co., Ltd.) and Troysol S-366 (produced by Troy Chemical Industries, Inc.). A polysiloxane polymer, KP-341 (produced by Shin-Etsu Chemical Co., Ltd.) can also be used as the silicone surfactant.

As the surfactant, in addition to the aforementioned known surfactants, such a surfactant can be used that contains a polymer having a fluoroaliphatic group derived from a fluoroaliphatic compound produced by a telomerization process (which is also referred to as a telomer process) or an oligomerization process (which is also referred to as an oligomer process). The fluoroaliphatic compound can be synthesized by the process disclosed in JP-A-2002-90991.

The polymer having a fluoroaliphatic group is preferably a copolymer of a monomer having the fluoroaliphatic group and poly(oxyalkylene) acrylate and/or poly(oxyalkylene) methacrylate, which may be a random copolymer or a block copolymer. Examples of the poly(oxyalkylene) group include a poly(oxyethylene) group, a poly(oxypropylene) group and a poly(oxybutylene) group, and also include such a unit that has alkylene chains having different chain lengths in one molecule, such as a block polymer of oxyethylene, oxypropylene and oxyethylene, and a block polymer of oxyethylene and oxypropylene. The copolymer of the monomer having a fluoroaliphatic group and poly(oxyalkylene) acrylate (or methacrylate) is not limited to a binary copolymer and may be a ternary or higher copolymer obtained by copolymerization of two or more kinds of monomers having a fluoroaliphatic group and two or more kinds of poly (oxyalkylene) acrylate (or methacrylate).

Examples thereof include Megafac F178, F-470, F-473, F-475, F-476 and F-472 (produced by Dainippon Ink and Chemicals, Inc.). Examples thereof further include a copolymer of an acrylate (or methacrylate) having a $C_6F_{13}$ group and poly(oxyalkylene) acrylate (or methacrylate), a copolymer of an acrylate (or methacrylate) having a $C_6F_{13}$ group, poly(oxyethylene) acrylate (or methacrylate) and poly(oxypropylene) acrylate (or methacrylate), a copolymer of an acrylate (or methacrylate) having a $C_8F_{17}$ group and poly (oxyalkylene) acrylate (or methacrylate), and a copolymer of an acrylate (or methacrylate) having a $C_8F_{17}$ group, poly(oxyethylene) acrylate (or methacrylate) and poly(oxypropylene) acrylate (or methacrylate).

[6] Other Components:

The positive resist composition according to the invention may further contain a dye, a photo base generator and the like, if desired.

1. Dye

A dye may be used in the invention.

Preferred examples of the dye include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS and Oil Black T-505 (all produced by Orient Chemical Co., Ltd.), Crystal Violet (C.I. 42555), Methyl Violet (C.I. 42535), Rhodamine B (C.I. 45170B), Malachite Green (C.I. 42000) and Methylene Blue (C.I. 52015).

2. Photo Base Generator

Examples of the photo base generator that can be used in the invention include compounds disclosed in JP-A-4-151156, JP-A-4-162040, JP-A-5-197148, JP-A-5-5995, JP-A-6-194834, JP-A-8-146608, JP-A-10-83079 and European Patent 622,682, and specific preferred examples thereof include 2-nitrobenzylcarbamate, 2,5-dinitrobenzylcyclohexylcarbamate, N-cyclohexyl-4-methylphenylsulfonamide and 1,1-dimethyl-2-phenylethyl-N-isopropylcarbamate. The photo base generator may be added for improving the resist shape.

3. Solvent

The resist composition of the invention is used by dissolving the aforementioned components in a solvent capable of dissolving the components and coating on a substrate. The solid concentration of the resist composition is preferably from 2 to 30% by weight, and more preferably from 3 to 25% by weight.

Preferred examples of the solvent include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrroridone and tetrahydrofuran. The solvents may be used solely or as a mixture.

The resist composition of the invention is coated on a substrate to form a thin film. The thickness of the coated film is preferably from 0.05 to 4.0 μm.

A commercially available inorganic or organic anti-reflective coating may be used in the invention depending on necessity. The anti-reflective coating may be coated as an underlayer of the resist.

The anti-reflective coating used as an underlayer of the resist may be an inorganic film type, such as titanium, titanium dioxide, titanium nitride, chromium oxide, carbon and amorphous silicon, or an organic film type comprising a light absorbent and a polymer material. The former necessitates such an apparatus as a vacuum deposition apparatus, a CVD apparatus and a sputtering apparatus for forming the film. Examples of the organic anti-reflective coating include an anti-reflective coating formed of a condensate of a diphenylamine derivative and a formaldehyde-modified melamine resin, an alkali-soluble resin and a light absorbent disclosed in JP-B-7-69611, an anti-reflective coating formed of a reaction product of a maleic anhydride copolymer and a diamine type light absorbent disclosed in U.S. Pat. No. 5,294,680, an anti-reflective coating containing a binder resin and a methylolmelamine thermal crosslinking agent disclosed in JP-A-6-118631, an acrylic resin anti-reflective coating having a carboxylic acid group, an epoxy group and a light absorbing group in one molecule disclosed in JP-A-6-118656, an anti-reflective coating comprising methylolmelamine and a benzophenone light absorbent disclosed in JP-A-8-87115, and an anti-reflective coating comprising a polyvinyl alcohol resin having a low molecular weight light absorbent added thereto disclosed in JP-A-8-179509.

As the organic anti-reflective coating, such a commercially available organic anti-reflective coating may be used as DUV 30 Series and DUV 40 series, produced by Brewer Science Inc.), and AR-2, AR-3 and AR-5, produced by Shipley Co.).

In the production of a high precision integrated circuit device and the like, a process for forming a pattern on a resist film may contain steps of: coating the positive resist composition of the invention on a substrate (such as a silicon/silicon dioxide coating substrate, a glass substrate, an ITO substrate, and a quartz/chromium oxide coating substrate) to form a resist film, irradiating the resist film with actinic ray or radiation, such as KrF excimer laser light, an electron beam ot EUV light, heating, developing, rinsing, and drying, whereby a good resist pattern can be obtained.

The alkali developer used for development may be an aqueous solution of an alkali, which ordinarily has a concentration of from 0.1 to 20% by weight. Examples of the alkali include an inorganic alkali, such as sodium hydroxide, potassium hydroxide, sodium carbonate, sodium silicate, sodium metasilicate and aqueous ammonia, a primary amine, such as ethylamine and n-propylamine, a secondary amine, such as diethylamine and di-n-butylamine, a tertiary amine, such as triethylamine and methyldiethylamine, an alcohol amine, such as dimethylmethanolamine and triethanolamine, a quaternary ammonium salt, such as tetramethylammonium hydroxide, tetraethylammonium hydroxide and choline, and a cyclic amine, such as pyrrole and piperidine. The aqueous solution of the alkali may further contain an alcohol, such as isopropyl alcohol, or a surfactant, such as a nonionic surfactant, in an appropriate amount.

Among the developers, a quaternary ammonium salt is preferably used, and tetramethylammonium hydroxide and choline are more preferably used.

The alkali developer ordinarily has pH of from 10 to 15.

The invention will be described in more detail with reference to the following examples, but the invention should not be construed as being limited thereto.

SYNTHESIS EXAMPLE 1

Synthesis of Resin A-2 p-Hydroxystyrene and 1-(1-adamantyl)-1-methylethyl methacrylate were charged in a ratio of 70/30 (by mole) and dissolved in tetrahydrofuran to prepare 100 mL of solution having a solid concentration of 20% by weight. A polymerization initiator (V-65, produced by Wako Pure Chemical Industries, Ltd.) was added to the solution in an amount of 2% by mole, and the solution was added dropwise to 10 mL of tetrahydrofuran heated to 60° C. over 4 hours under nitrogen atmosphere. After completing the dropwise addition, the reaction solution was heated for 4 hours, and 1% by mole of V-65 was again added thereto, followed by stirring for 4 hours. After completing the reaction, the reaction solution was cooled to room temperature and subjected to crystallization with 3 L of hexane, and white powder thus deposited was collected by filtration.

The composition ratio of the resulting polymer was 75/25 as measured by $C^{13}$ NMR. The polymer has a weight average molecular weight of 11,000 and a dispersion degree (Mw/Mn) of 1.70 as measured by GPC with standard polystyrene conversion.

The resins shown in Table 1 below having the structures described hereinbefore were synthesized in the same manner as in Synthesis Example 1.

TABLE 1

| Resin | Repeating Unit 1 (% by mole) | Repeating Unit 2 (% by mole) | Repeating Unit 3 (% by mole) | Weight Average Molecular Weight | Dispersion Degree of Molecular Weight |
|---|---|---|---|---|---|
| A-2 | 75 | 25 | — | 11,000 | 1.70 |
| A-1 | 72 | 28 | — | 8,800 | 1.94 |
| A-5 | 79 | 21 | — | 7,900 | 1.60 |
| A-7 | 65 | 35 | — | 13,500 | 1.85 |

TABLE 1-continued

| Resin | Repeating Unit 1 (% by mole) | Repeating Unit 2 (% by mole) | Repeating Unit 3 (% by mole) | Weight Average Molecular Weight | Dispersion Degree of Molecular Weight |
|---|---|---|---|---|---|
| A-8 | 74 | 26 | — | 6,500 | 2.25 |
| A-10 | 77 | 23 | — | 10,500 | 1.80 |
| A-11 | 60 | 40 | — | 12,500 | 1.55 |
| A-13 | 68 | 23 | 9 | 11,500 | 1.68 |
| A-14 | 71 | 24 | 5 | 9,000 | 1.92 |
| A-16 | 65 | 25 | 10 | 16,000 | 1.77 |

Sulfonic acid generators used in the examples were prepared in the known process.

EXAMPLE 1

(1) Preparation and Coating of Positive Resist

| Resin A-2 | 0.93 g |
| Sulfonic acid generator B-1 | 0.07 g |

The aforementioned components were dissolved in 8.8 g of propylene glycol monomethylether acetate, to which 0.003 g of nitrogen-containing basic compound C-1 (shown below) and 0.001 g of surfactant (Megafac F176, hereinafter, referred to as W-1, produced by Dainippon Ink and Chemicals, Inc.) were then added and dissolved therein. The resulting solution was subjected to microfiltration with a membrane filter of 0.1 μm pore to obtain a resist solution.

The resist solution was coated on a 6-inch silicon wafer by using a spin coater Mark 8, produced by Tokyo Electron, Ltd., and baked at 110° C. for 90 seconds, so as to obtain a uniform film having a thickness of 0.25 μm.

(2) Formation of Positive Resist Pattern

The resist film thus obtained was irradiated with an electron beam by using an electron beam drawing apparatus (HL750, produced by Hitachi, Ltd., acceleration voltage: 50 KeV). After completing the irradiation, the resist film was baked at 110° C. for 90 seconds and immersed in a 2.38% by weight aqueous solution of tetramethylammonium hydroxide (TMAH) for 60 seconds, followed by rinsing with water for 30 seconds and drying. The resulting pattern was evaluated in the following manner.

(2-1) Sensitivity

The cross sectional shape of the resulting pattern was observed with a scanning electron microscope (S-4300, produced by Hitachi, Ltd.). Minimum irradiation energy required for resolving a 0.15 μm line (line/space=1/1) was designated as the sensitivity.

(2-2) Resolution

A limiting resolution (where line and space were separately resolved) at the irradiation energy for obtaining the aforementioned sensitivity was designated as the resolution.

(2-3) Pattern Shape

The cross sectional shape of a 0.15 μm line pattern at the irradiation energy for obtaining the aforementioned sensitivity was observed with a scanning electron microscope (S-4300, produced by Hitachi, Ltd.) and evaluated in terms of three grades, rectangular, slightly tapered and tapered.

(2-4) Line Edge Roughness

A 0.15 μm line pattern at the irradiation energy for obtaining the aforementioned sensitivity was measured for the width thereof at arbitrary 30 points over an area of 50 μm in the longitudinal direction of the line pattern, and the standard deviation of the measured values was obtained to evaluate the fluctuation in terms of 3σ.

The results obtained in Example 1 were very good. Specifically, the sensitivity was 4.5 μC/cm², the resolution was 0.10 μm, the pattern shape was rectangular, and the line edge roughness was 7.0 nm.

EXAMPLES 2 TO 13

Preparation and coating of resist composition, and evaluation by exposure with an electron beam were carried out in the same manner as in Example 1 using the compounds shown in Table 2 below.

COMPARATIVE EXAMPLE 1

Preparation and coating of resist composition, and evaluation by exposure with an electron beam were carried out in the same manner as in Example 1 except for using only an acid generator generating a non-aromatic sulfonic acid compound as the sulfonic acid generator as shown in Table 2.

COMPARATIVE EXAMPLE 2

Preparation and coating of resist composition, and evaluation by exposure with an electron beam were carried out in the same manner as in Example 1 except for using Resin AA-1 having no alicyclic group in the acid decomposable group as shown in Table 2. Resin AA-1:

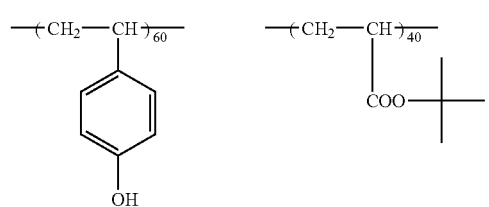

The evaluation results of Examples 2 to 13 and Comparative Examples 1 and 2 are shown in Table 2 together with the evaluation results of Example 1.

The meanings of the symbols indicating the components in Table 2 are shown below.

The resins and sulfonic acid generators (B) and (C) are those as described hereinbefore. The organic basic compounds and surfactants are as follows.

(Organic Basic Compound)
D-1: Tri-n-hexylamine
D-2: 2,4,6-Ttriphenylimidazole
D-3: Tetra-(n-butyl)ammonium hydroxide (Surfactant)
W-1: Fluorine surfactant, Megafac F176 (produced by Dainippon Ink and Chemicals, Inc.)
W-2: Fluorine/silicone surfactant, Megafac R08 (produced by Dainippon Ink and Chemicals, Inc.)
W-3: Silicone surfactant, Siloxane polymer KP341 (produced by Shin-Etsu Chemical Co., Ltd.)

TABLE 2

| | | Composition | | | |
|---|---|---|---|---|---|
| | Resin | Sulfonic Acid Generator (B) | Sulfonic Acid Generator (C) | Basic Compound (0.003 g) | Other Component (0.001 g) |
| Example 1 | A-2 | B-1 (0.07 g) | — | D-1 | W-1 |
| Example 2 | A-1 | B-2 (0.07 g) | — | D-1 | W-1 |
| Example 3 | A-5 | B-4 (0.07 g) | — | D-1 | W-1 |
| Example 4 | A-7 | B-5 (0.05 g) | C-5 (0.02 g) | D-3 | W-1 |
| Example 5 | A-8 | B-6 (0.07 g) | — | D-2 | — |
| Example 6 | A-10 | B-7 (0.07 g) | — | D-2 | W-1 |
| Example 7 | A-11 | B-8 (0.06 g) | C-1 (0.01 g) | D-1 | W-2 |
| Example 8 | A-13 | B-11 (0.07 g) | — | D-3 | W-2 |
| Example 9 | A-14 | B-15 (0.05 g) | C-39 (0.02 g) | D-1 | W-3 |
| Example 10 | A-16 | B-20 (0.07 g) | — | D-3 | W-3 |
| Comparative Example 1 | A-2 | — | C-2 (0.07 g) | D-1 | W-1 |
| Comparative Example 2 | AA-1 | B-1 (0.07 g) | — | D-1 | W-1 |

| | Evaluation | | | |
|---|---|---|---|---|
| | Sensitivity ($\mu C/cm^2$) | Resolution ($\mu m$) | Pattern Shape | Line Edge Roughness (nm) |
| Example 1 | 4.5 | 0.10 | rectangular | 7.0 |
| Example 2 | 5.5 | 0.10 | rectangular | 6.0 |
| Example 3 | 4.0 | 0.11 | slightly tapered | 7.5 |
| Example 4 | 5.0 | 0.09 | rectangular | 6.5 |
| Example 5 | 5.5 | 0.09 | rectangular | 6.0 |
| Example 6 | 6.0 | 0.09 | rectangular | 6.0 |
| Example 7 | 4.5 | 0.10 | rectangular | 5.5 |
| Example 8 | 4.5 | 0.11 | rectangular | 6.5 |
| Example 9 | 5.5 | 0.11 | rectangular | 7.0 |
| Example 10 | 5.0 | 0.10 | rectangular | 7.5 |
| Comparative Example 1 | 5.0 | 0.14 | tapered | 13.5 |
| Comparative Example 2 | 6.5 | 0.14 | tapered | 15.0 |

It is understood from Table 2 that the positive resist compositions of the invention exhibit the high sensitivity and high resolution and are excellent in the pattern shape and line edge roughness according to the pattern formation by irradiation with an electron beam in comparison with the resist compositions of Comparative Examples.

EXAMPLE 11

Preparation and coating of resist composition were carried out in the same manner as in Example 1 using the compounds shown in Table 3 below to obtain a resist film. The resist film has a thickness of 0.40 μm.

(3) Formation of Positive Pattern

The resist film thus obtained was subjected to pattern exposure using a KrF excimer laser stepper (FPA300 OEX-5, produced by Canon Inc., wavelength: 248 nm). The treatments after the exposure were carried out in the same manner as in Example 1. The pattern was evaluated in the following manner.

(3-1) Sensitivity

The cross sectional shape of the resulting pattern was observed with a scanning electron microscope (S-4300, produced by Hitachi, Ltd.). Minimum irradiation energy required for dissolving a 0.18 μm line (line/space=1/1) was designated as the sensitivity.

(3-2) Resolution

A limiting resolution (where line and space were separately resolved) at the irradiation energy for obtaining the aforementioned sensitivity was designated as the resolution power.

(3-3) Pattern Shape

The cross sectional shape of a 0.18 μm line pattern at the irradiation energy for obtaining the aforementioned sensitivity was observed with a scanning electron microscope (S-4300, produced by Hitachi, Ltd.) and evaluated in terms of three grades, rectangular, slightly tapered and tapered.

(3-4) Line Edge Roughness

A 0.18 μm line pattern at the irradiation energy for obtaining the aforementioned sensitivity was measured for the width thereof at arbitrary 30 points over an area of 50 μm in the longitudinal direction of the line pattern, and the standard deviation of the measured values was obtained to evaluate the fluctuation in terms of 3σ.

The results obtained in Example 11 were very good. Specifically, the sensitivity was 17 mJ/cm², the resolution was 0.15 µm, the pattern shape was rectangular, and the line edge roughness was 6.5 nm. The evaluation results are also shown in Table 3 below.

EXAMPLES 12 TO 17

Preparation and coating of resist composition, and evaluation by exposure with KrF excimer laser were carried out in the same manner as in Example 11 using the compounds shown in Table 3 below. The evaluation results are shown in Table 3.

COMPARATIVE EXAMPLE 3

Preparation and coating of resist composition, and evaluation by exposure with KrF excimer laser were carried out in the same manner as in Example 11 except for using only an acid generator generating a non-aromatic sulfonic acid compound as the sulfonic acid generator as shown in Table 3.

COMPARATIVE EXAMPLE 4

Preparation and coating of resist composition, and evaluation by exposure with KrF excimer laser were carried out in the same manner as in Example 11 except for using Resin AA-1 having no alicyclic group in the acid decomposable group as shown in Table 3.

The evaluation results of Examples 12 to 17 and Comparative Examples 3 and 4 are shown in Table 3 together with the evaluation results of Example 11.

It is understood from Table 3 that the positive resist compositions of the invention exhibit the high sensitivity and high resolution and are excellent in the pattern shape and line edge roughness according to the pattern formation by irradiation with KrF excimer laser in comparison with the resist compositions of Comparative Examples.

EXAMPLES 18 TO 20

Resist films were obtained in the same manner as in Example 1 using the resist compositions in Examples 1 to 3 respectively, provided that the thickness of the resist film was changed to 0.13 µm. The resulting resist films were subjected to surface exposure using EUV light (wavelength: 13 nm) in exposure amounts varied within a range of from 0 to 5.0 mJ with an interval of 0.5 mJ, and then baked at 110° C. for 90 seconds. Thereafter, the dissolution rate of the resist film was measured for each of the exposure amounts using a 2.38% by weight aqueous solution of tetramethylammonium hydroxide (TMAH) to obtain a sensitivity curve. An exposure amount at which the dissolution rate of the resist film was saturated on the sensitivity curve was designated as sensitivity, and a dissolution contrast (γ value) was calculated from the gradient of the linear part of the sensitivity curve. The larger the γ value is, the better the dissolution contrast is.

COMPARATIVE EXAMPLE 5

Preparation and coating of resist composition, and evaluation by exposure with EUV light were carried out in the same manner as in Example 18 except for using only an acid generator generating a non-aromatic sulfonic acid compound as the sulfonic acid generator as shown in Table 4.

TABLE 3

| | Composition | | | | |
| --- | --- | --- | --- | --- | --- |
| | Resin | Sulfonic Acid Generator (B) | Sulfonic Acid Generator (C) | Basic Compound (0.003 g) | Other Component (0.001 g) |
| Example 11 | A-2 | B-1 (0.07 g) | — | D-1 | W-1 |
| Example 12 | A-1 | B-4 (0.07 g) | — | D-1 | W-2 |
| Example 13 | A-5 | B-7 (0.07 g) | — | D-2 | W-1 |
| Example 14 | A-7 | B-11 (0.05 g) | C-5 (0.02 g) | D-1 | W-1 |
| Example 15 | A-10 | B-23 (0.05 g) | C-43 (0.02 g) | D-1 | W-3 |
| Example 16 | A-14 | B-25 (0.05 g) | C-44 (0.02 g) | D-3 | W-1 |
| Example 17 | A-13 | B-35 (0.05 g) | C-1 (0.01 g) | D-1 | W-1 |
| Comparative Example 3 | A-2 | — | C-2 (0.07 g) | D-1 | W-1 |
| Comparative Example 4 | AA-1 | B-1 (0.07 g) | — | D-1 | W-1 |

| | Evaluation | | | |
| --- | --- | --- | --- | --- |
| | Sensitivity (mJ/cm²) | Resolution (µm) | Pattern Shape | Line Edge Roughness (nm) |
| Example 11 | 17 | 0.15 | rectangular | 6.5 |
| Example 12 | 21 | 0.14 | rectangular | 7.0 |
| Example 13 | 18 | 0.15 | rectangular | 6.0 |
| Example 14 | 22 | 0.15 | rectangular | 6.5 |
| Example 15 | 20 | 0.14 | rectangular | 6.5 |
| Example 16 | 14 | 0.15 | rectangular | 7.5 |
| Example 17 | 19 | 0.15 | rectangular | 7.0 |
| Comparative Example 3 | 25 | 0.17 | tapered | 12.0 |
| Comparative Example 4 | 30 | 0.17 | tapered | 13.5 |

COMPARATIVE EXAMPLE 6

Preparation and coating of resist composition, and evaluation by exposure with EUV light were carried out in the same manner as in Example 18 except for using Resin AA-1 having no alicyclic group in the acid decomposable group as shown in Table 4.

The evaluation results of Examples 18 to 20 and Comparative Examples 5 and 6 are shown in Table 4.

TABLE 4

| | | Composition | | | | Evaluation | |
|---|---|---|---|---|---|---|---|
| | Resin | Sulfonic Acid Generator (B) | Sulfonic Acid Generator (C) | Basic Compound (0.003 g) | Other Component (0.001 g) | Sensitivity (mJ/cm2) | γ value |
| Example 18 | A-2 | B-1 (0.07 g) | — | D-1 | W-1 | 2.0 | 9.5 |
| Example 19 | A-1 | B-2 (0.07 g) | — | D-1 | W-1 | 2.0 | 10.5 |
| Example 20 | A-5 | B-4 (0.07 g) | — | D-1 | W-1 | 2.5 | 9.0 |
| Comparative Example 5 | A-2 | — | C-2 (0.07 g) | D-1 | W-1 | 3.5 | 6.0 |
| Comparative Example 6 | AA-1 | B-1 (0.07 g) | — | D-1 | W-1 | 4.5 | 5.0 |

It is understood from Table 4 that the positive resist compositions of the invention exhibit the high sensitivity and high contrast according to the pattern formation by irradiation with EUV light in comparison with the resist compositions of Comparative Examples.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition comprising:
   (A) a resin containing a repeating unit represented by the following formula (1) and a repeating unit represented by the following formula (2), the resin being insoluble or slightly soluble in an alkali developer and becoming soluble in an alkali developer by an action of an acid,
   (B) a compound generating a sulfonic acid compound represented by the following formula (3) upon irradiation of actinic ray or radiation, and
   (C) a compound generating a non-aromatic sulfonic acid compound upon irradiation of actinic ray or radiation,

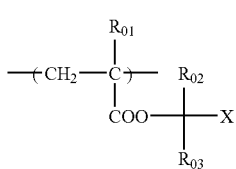
(1)

wherein $R_{01}$ represents a hydrogen atom, a methyl group, a cyano group, a halogen atom or a perfluoro group having from 1 to 4 carbon atoms, $R_{02}$ and $R_{03}$ each independently represents an alkyl group, and X represents an acid decomposable group having an alicyclic group,

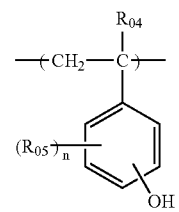
(2)

wherein $R_{04}$ represents a hydrogen atom or a methyl group, $R_{05}$ represents a hydrogen atom, an alkyl group, a halogen atom, an aryl group, an alkoxy group or an acyl group, and n represents an integer of from 0 to 4,

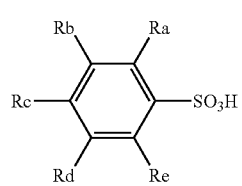
(3)

wherein Ra to Re each independently represents a hydrogen atom, an unsubstituted alkyl group or an alkyl group substituted with an aryl group, a hydroxyl group or an alkoxy group, a cycloalkyl group, an alkoxy group, a hydroxyl group, a carboxyl group, an alkyloxycarbonyl group, an alkylcarbonyloxy group, an aryl group or an aralkyl group, wherein the resin (A) further contains a repeating unit represented by the following formula (4):

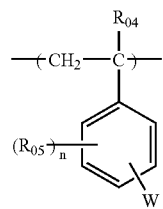

(4)

wherein $R_{O4}$, $R_{O5}$ and n have the same meanings as $R_{O4}$, $R_{O5}$ and n in formula (2) respectively, and W represents a group that is not decomposed by an action of an acid.

2. The positive resist composition as claimed in claim 1, which further comprises an organic basic compound.

3. The positive resist composition as claimed in claim 1, wherein X in formula (1) represents a bridged alicyclic group.

4. The positive resist composition as claimed in claim 3, wherein the bridged alicyclic group represented by X in formula (1) is an adamantyl group.

5. The positive resist composition as claimed in claim 1, which further comprises a fluorine surfactant and/or a silicone surfactant.

6. A process for forming a pattern comprising steps of: forming a resist film with the positive resist composition as claimed in claim 1; exposing the resist film; and developing the exposed resist film.

7. The positive resist composition as claimed in claim 1, wherein the content of the sulfonic acid generator (B) is from 5 to 20% by weight.

8. The positive resist composition as claimed in claim 1, wherein the non-aromatic sulfonic acid generated by the acid generator (C) is an alkylsulfonic acid having from 2 to 20 carbon atoms, which may have a substituent.

9. The positive resist composition as claimed in claim 1, wherein the weight ratio of the sulfonic acid generator (B) to the sulfonic acid generator (C) is at least 5/95.

10. The positive resist composition as claimed in claim 1, wherein the weight ratio of the sulfonic acid generator (B) to the sulfonic acid generator (C) is at least 20/80.

11. The positive resist composition as claimed in claim 1, wherein the weight ratio of the sulfonic acid generator (B) to the sulfonic acid generator (C) is at least 40/60.

* * * * *